United States Patent [19]

Sekino et al.

[11] Patent Number: 4,568,910

[45] Date of Patent: Feb. 4, 1986

[54] ANALOG-TO-DIGITAL CONVERTER

[75] Inventors: Takeo Sekino, Atsugi; Masashi Takeda, Isehara, both of Japan

[73] Assignee: Sony Corporation, Tokyo, Japan

[21] Appl. No.: 450,777

[22] Filed: Dec. 17, 1982

[30] Foreign Application Priority Data

Dec. 22, 1981 [JP] Japan ................................ 56-207399

[51] Int. Cl.$^4$ ........................................... H03K 13/02
[52] U.S. Cl. ............................................. 340/347 AD
[58] Field of Search .................................. 340/347 AD

[56] References Cited

U.S. PATENT DOCUMENTS

4,417,233 11/1983 Inoue ........................... 340/347 AD

*Primary Examiner*—Charles D. Miller
*Attorney, Agent, or Firm*—Lewis H. Eslinger; Alvin Sinderbrand

[57] ABSTRACT

An analog-to-digital converter for converting an analog input signal to a digital output signal with m upper bits and n lower bits includes $2^{m+n}-1$ resistors establishing $2^{m+n}$ reference voltages for comparison with an amplitude of the analog input signal, $2^m-1$ voltage comparing circuits for comparing the analog input signal with $2^n$ step-by-step reference voltages, a first encoder for encoding the output signals of the $2^{m-1}$ voltage comparing circuits for generating m upper bits of the digital output signal, a matrix circuit having $2^m(2^n-1)$ voltage comparators for comparing the analog input signal with the remaining reference voltages of the $2^{m+n}$ references voltages, the other voltage comparing circuits being supplied output signals of the matrix circuit and a second encoder for encoding output signals of the other voltage comparing circuits for generating n lower bits of the digital output signal.

15 Claims, 15 Drawing Figures

| Vin | $m_1$ | $\overline{m_1}$ | $m_2$ | $\overline{m_2}$ | $m_3$ | $\overline{m_3}$ | $m_1$ | $\overline{m_1}+m_2$ | $\overline{m_2}+m_3$ | $\overline{m_3}$ | $D_3$ | $D_2$ |
|---|---|---|---|---|---|---|---|---|---|---|---|---|
| $V_{15} \leq V_{in}$ | H | L | H | L | H | L | H | H | H | L | | |
| $V_{14} \leq V_{in} < V_{15}$ | H | L | H | L | H | L | H | H | H | L | 1 | 1 |
| $V_{13} \leq\ ''\ < V_{14}$ | H | L | H | L | H | L | H | H | H | L | | |
| $V_{12} \leq\ ''\ < V_{13}$ | H | L | H | L | H | L | H | H | H | L | | |
| $V_{11} \leq\ ''\ < V_{12}$ | H | L | H | L | L | H | H | H | L | H | | |
| $V_{10} \leq\ ''\ < V_{11}$ | H | L | H | L | L | H | H | H | L | H | 1 | 0 |
| $V_9 \leq\ ''\ < V_{10}$ | H | L | H | L | L | H | H | H | L | H | | |
| $V_8 \leq\ ''\ < V_9$ | H | L | H | L | L | H | H | H | L | H | | |
| $V_7 \leq\ ''\ < V_8$ | H | L | L | H | L | H | H | L | H | H | | |
| $V_6 \leq\ ''\ < V_7$ | H | L | L | H | L | H | H | L | H | H | 0 | 1 |
| $V_5 \leq\ ''\ < V_6$ | H | L | L | H | L | H | H | L | H | H | | |
| $V_4 \leq\ ''\ < V_5$ | H | L | L | H | L | H | H | L | H | H | | |
| $V_3 \leq\ ''\ < V_4$ | L | H | L | H | L | H | L | H | H | H | | |
| $V_2 \leq\ ''\ < V_3$ | L | H | L | H | L | H | L | H | H | H | 0 | 0 |
| $V_1 \leq\ ''\ < V_2$ | L | H | L | H | L | H | L | H | H | H | | |
| $\ ''\ < V_1$ | L | H | L | H | L | H | L | H | H | H | | |

FIG. 4A

| Vin | $\overline{n_{11}}$ | $\overline{n_{12}}\cdot\overline{n_{21}}$ | $\overline{n_{22}}\cdot\overline{n_{31}}$ | $\overline{n_{32}}\cdot\overline{n_{41}}$ | $\overline{n_{42}}\cdot\overline{n_{51}}$ | $\overline{n_{52}}\cdot\overline{n_{61}}$ | $\overline{n_{62}}$ | $n_{11}$ |
|---|---|---|---|---|---|---|---|---|
| $V_{15} \leq V_{in}$ | H | L·H | L·H | L·H | L·H | L·H | L | L |
| $V_{14} \leq V_{in} < V_{15}$ | H | L·H | L·H | L·H | L·H | L·L | H | L |
| $V_{13} \leq \;\;\prime\prime\;\; < V_{14}$ | H | L·H | L·H | L·H | L·L | H·L | H | L |
| $V_{12} \leq \;\;\prime\prime\;\; < V_{13}$ | H | L·H | L·H | L·L | H·L | H·L | H | L |
| $V_{11} \leq \;\;\prime\prime\;\; < V_{12}$ | H | L·H | L·H | L·L | H·L | H·L | H | L |
| $V_{10} \leq \;\;\prime\prime\;\; < V_{11}$ | H | L·H | L·H | H·L | H·L | H·L | H | L |
| $V_{9} \leq \;\;\prime\prime\;\; < V_{10}$ | H | L·L | H·L | H·L | H·L | H·L | H | L |
| $V_{8} \leq \;\;\prime\prime\;\; < V_{9}$ | L | H·L | H·L | H·L | H·L | H·L | H | H |
| $V_{7} \leq \;\;\prime\prime\;\; < V_{8}$ | L | H·L | H·L | H·L | H·L | H·L | H | H |
| $V_{6} \leq \;\;\prime\prime\;\; < V_{7}$ | L | H·L | H·L | H·L | H·L | H·H | L | H |
| $V_{5} \leq \;\;\prime\prime\;\; < V_{6}$ | L | H·L | H·L | H·L | H·H | L·H | L | H |
| $V_{4} \leq \;\;\prime\prime\;\; < V_{5}$ | L | H·L | H·L | H·H | L·H | L·H | L | H |
| $V_{3} \leq \;\;\prime\prime\;\; < V_{4}$ | L | H·L | H·L | H·H | L·H | L·H | L | H |
| $V_{2} \leq \;\;\prime\prime\;\; < V_{3}$ | L | H·L | H·H | L·H | L·L | L·H | L | H |
| $V_{1} \leq \;\;\prime\prime\;\; < V_{2}$ | L | H·H | H·H | L·H | L·H | L·H | L | H |
| $\;\;\prime\prime\;\; < V_{1}$ | L | L·H | H·H | L·H | L·H | L·H | L | L |

| FIG. 4A | FIG. 4B |

FIG. 4B

| $\overline{n_{62}}$ | $n_{11}$ | $n_{12} \cdot n_{21}$ | $n_{22} \cdot n_{31}$ | $n_{32} \cdot n_{41}$ | $n_{42} \cdot n_{51}$ | $n_{52} \cdot n_{61}$ | $n_{62}$ | $E_1$ | $E_0$ | $D_1$ | $D_0$ |
|---|---|---|---|---|---|---|---|---|---|---|---|
| L | L | H·L | H·L | H·L | H·L | H·L | H | 0 | 0 | 1 | 1 |
| H | L | H·L | H·L | H·L | H·L | [H·H] | L | 0 | 1 | 1 | 0 |
| H | L | H·L | H·L | H·L | [H·H] | L·H | L | 1 | 0 | 0 | 1 |
| H | L | H·L | H·L | [H·H] | L·H | L·H | L | 1 | 1 | 0 | 0 |
| H | L | H·L | H·L | [H·H] | L·H | L·H | L | 1 | 1 | 1 | 1 |
| H | L | H·L | [H·H] | L·H | L·H | L·H | L | 1 | 0 | 1 | 0 |
| H | L | [H·H] | L·H | L·H | L·H | L·H | L | 0 | 1 | 0 | 1 |
| H | H | L·H | L·H | L·H | L·H | L·H | L | 0 | 0 | 0 | 0 |
| H | H | L·H | L·H | L·H | L·H | L·H | L | 0 | 0 | 1 | 1 |
| L | H | L·H | L·H | L·H | L·H | L·L | H | 0 | 1 | 1 | 0 |
| L | H | L·H | L·H | L·H | L·L | H·L | H | 1 | 0 | 0 | 1 |
| L | H | L·H | L·H | L·H | H·L | H·L | H | 1 | 1 | 0 | 0 |
| L | H | L·H | L·H | L·L | H·L | H·L | H | 1 | 1 | 1 | 1 |
| L | H | L·H | L·L | H·L | H·L | H·L | H | 1 | 0 | 1 | 0 |
| L | H | L·L | H·L | H·L | H·L | H·L | H | 0 | 1 | 0 | 1 |
| L | L | H·L | H·L | H·L | H·L | H·L | H | 0 | 0 | 0 | 0 |

FIG. 5

ANALOG-TO-DIGITAL CONVERTER

BACKGROUND OF THE INVENTION

1. Field of the Invention

This invention relates to an analog-to-digital converter, and more particularly, to a compact, high speed analog-to-digital converter.

2. Description of the Prior Art

Prior art high speed analog-to-digital (A/D) converters can generally be classified as either parallel-type converters or serial-type converters. Parallel type A/D converters which convert an analog input signal to, for example, 8-bit digital output signals generally require 255 complex voltage comparing circuits connected in parallel. These circuits require a large number of devices and large power consumption and result in a large chip size for the IC (Integrated Circuit). Serial-to-parallel A/D converters having an output of m upper bits and n lower bits which convert an analog input signal to 8-bit digital output signals require 30 complex voltage comparing circuits, result in low power consumption, and result in a small size chip for the IC. However this serial-to-parallel A/D converter requires a digital-to-analog converter and subtracter for A/D converting with upper bits and lower bits separately, so that it is difficult to convert the analog input signal to digital output signal exactly. It is feared, for example, that the serial-to-parallel A/D converter produces non-sequential values for converting a continuously increasing analog input signal to digital signal.

OBJECTS AND SUMMARY OF THE INVENTION

Accordingly, it is an object of the present invention to provide an analog-to digital converter which does not have the aforesaid problems of the prior art analog-to-digital converters. It is another object of the present invention to provide an A/D converter on a semiconductor pellet which results in a compact integrated circuit. It is still another object of the present invention to provide a high speed A/D converter. It is still a further object of the present invention to provide a low power consumption A/D converter.

According to one aspect of the present invention the analog-to-digital convertor converts the analog input signal to a digital output signal having m upper bits and n lower bits using $(2^{m+n}-1)$ resistors connected in a series circuit to a voltage source to establish respective reference voltages in which the $(2^m-1)$ upper bit comparator circuits have first input terminals that receive the analog input signal and second input terminals that are connected to the series resistor circuit at $2^n$ intervals, thereby defining $2^n$ groups of resistors therebetween. The upper bit encoder receives the output signals from the $2^{n-1}$ upper bit bit comparator circuits and generate upper bits. Similarly, a lower bit matrix comparator circuit has $2^n(2^m-1)$ comparators whose first input terminals receive the analog signal and second input terminals are connected to respective nodes of the series resistor circuits, except that a plurality of nodes of the resistor means have the second input terminals of the $2^m-1$ upper bits connected thereto. The lower bit encoder means are connected to the lower bits of the matrix comparator circuit to generate the lower bits.

DETAILED DESCRIPTION OF PREFERRED EMBODIMENTS

High speed analog-to-digital (A/D) converters are formed in general as parallel type or serial-parallel type.

The A/D converter of parallel type requires 255 voltage comparators of complex arrangement for converting an analog input voltage to a digital output of, for example, 8 bits. This causes the number of circuit elements to increase so that power consumption is increased and also a chip size of the A/D converter is enlarged when formed as an integrated circuit (IC).

An A/D converter of serial-parallel type requires only 30 voltage comparators for converting the analog input voltage to the 8-bit digital output, thus reducing power consumption and the chip size thereof when formed as an IC. But, this serial-parallel type A/D converter is required to specially employ a digital-to-analog (D/A) converter that individually A/D-converts upper and lower bits of the digital output so that it is difficult to establish precision upon A/D conversion. For example, when the analog input voltage increases continuously, the digital output does not increase continuously and hence there are caused dip and peak.

This invention is to provide an A/D converter which can obviate the aforesaid defects with few circuit elements.

Figure 1A:
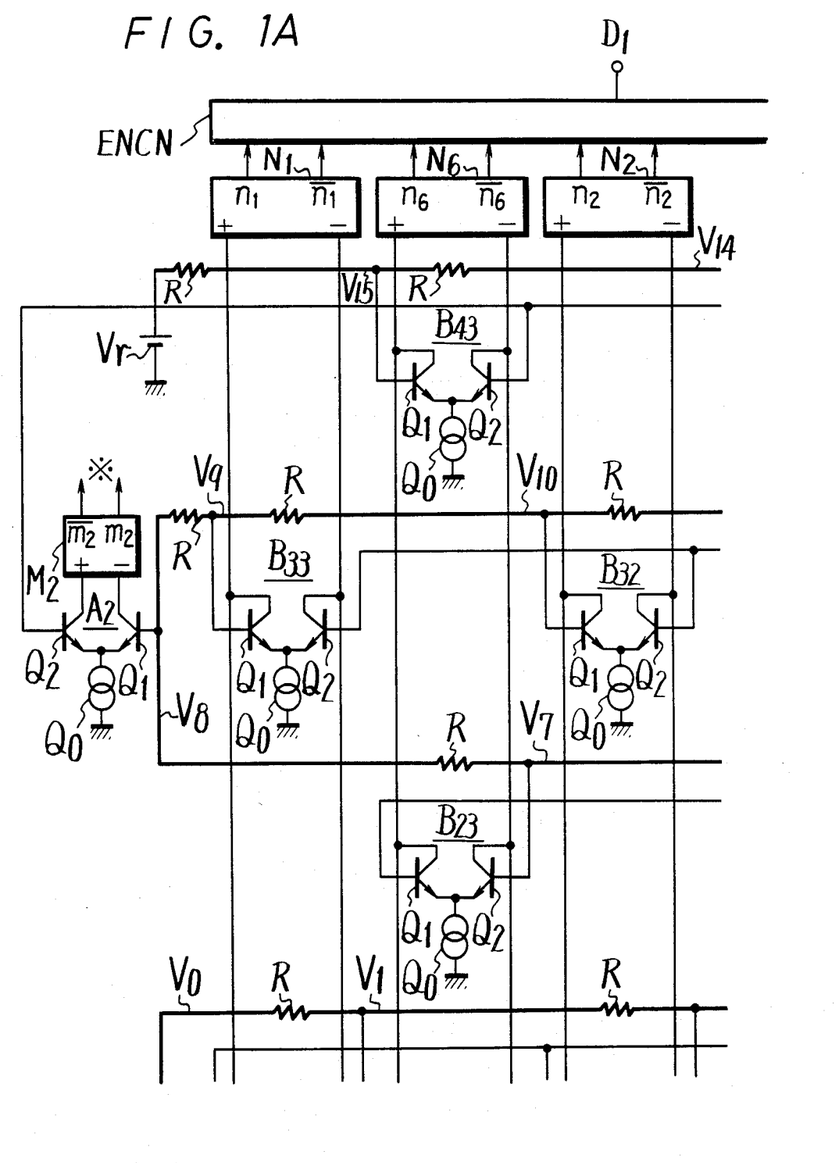
FIGS. 1A, 1B, 1C, 1D, 2A, 2B 2C and 2D illustrate an embodiment of an analog-to-digital converter in accord with the present invention.
Figure 1B:
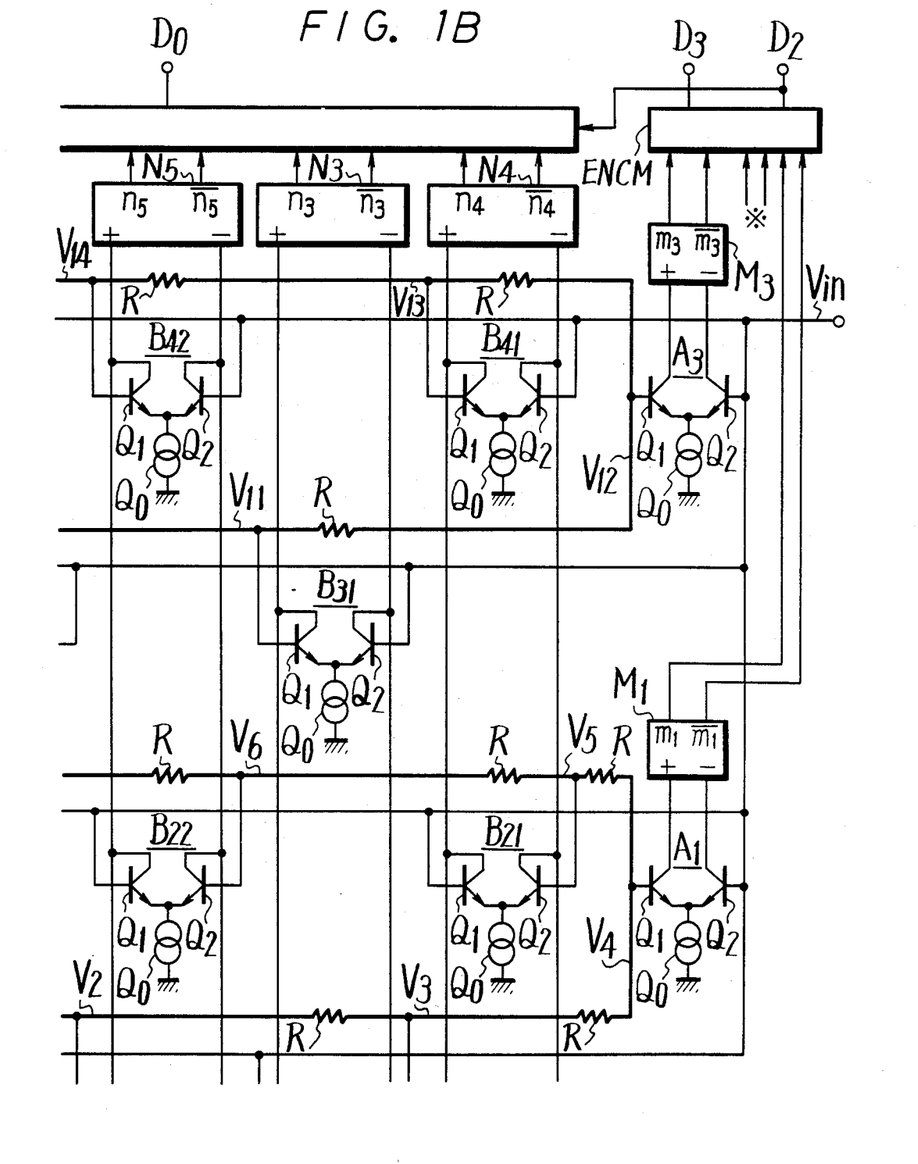
Figure 1C:
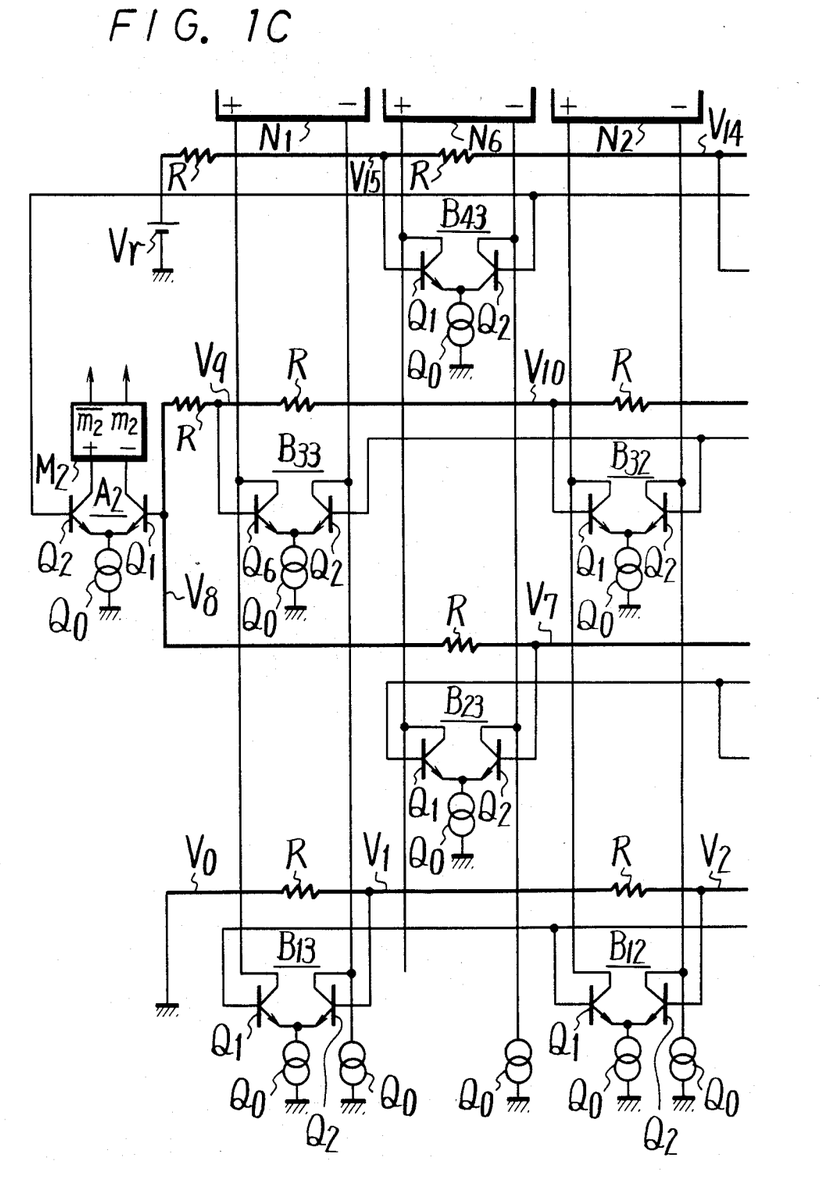
Figure 1D:
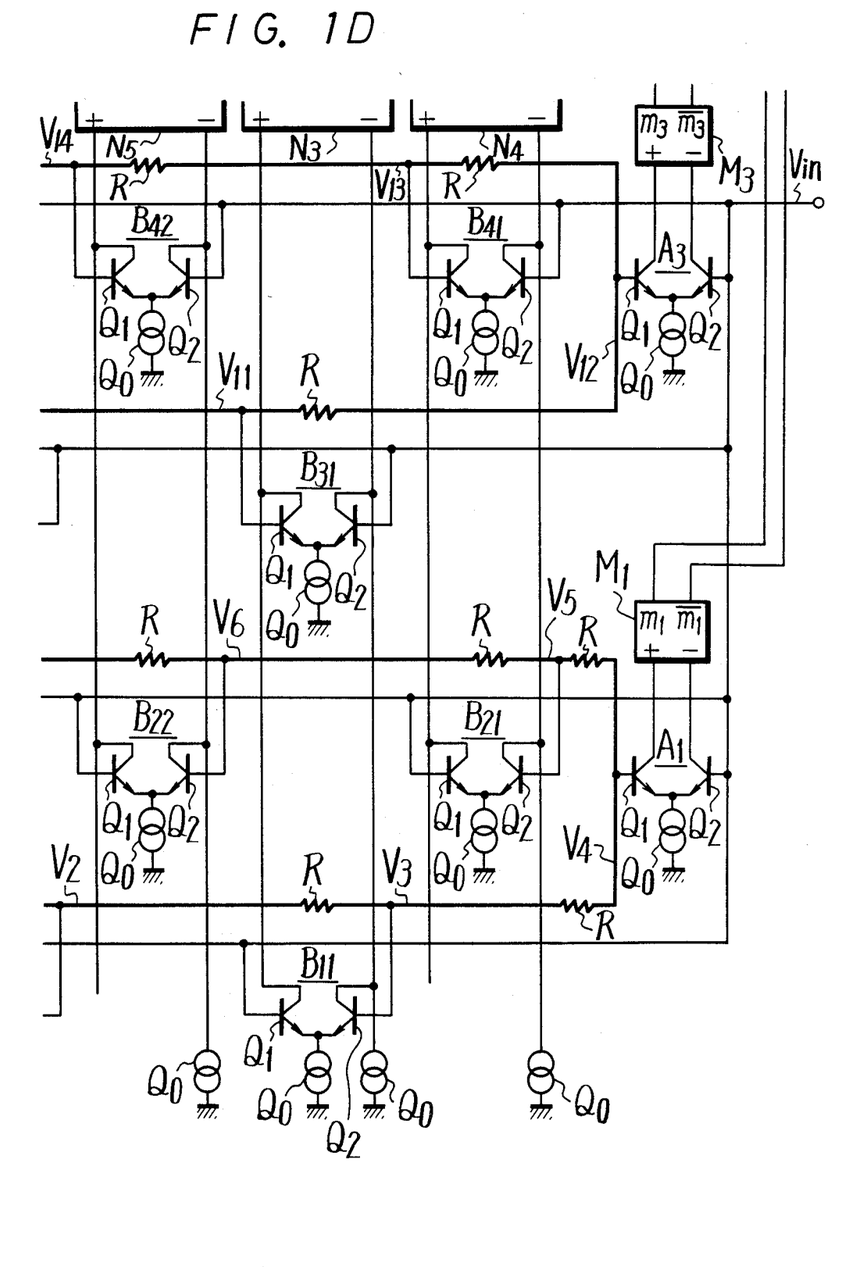
Figure 2A:
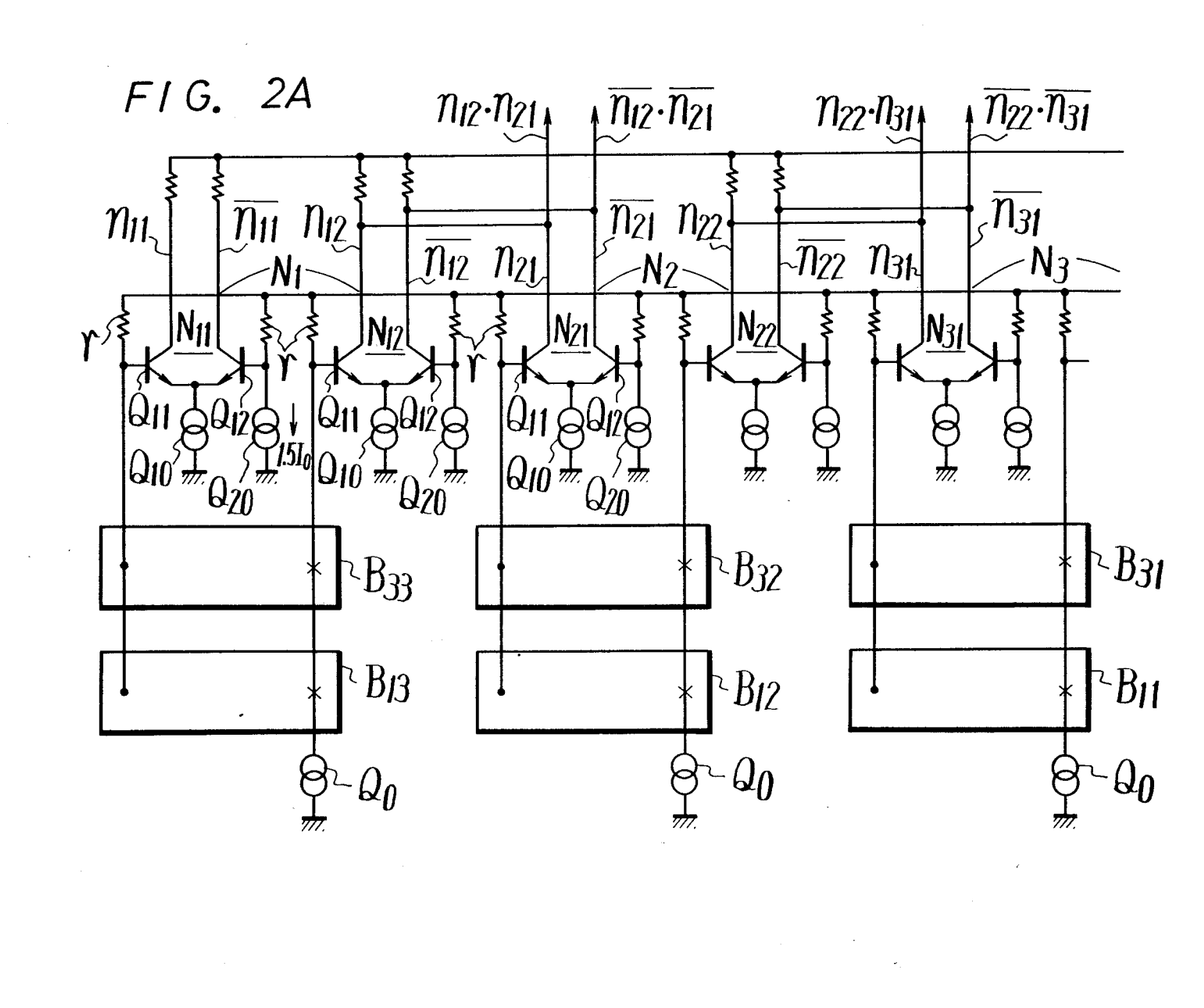
Figure 2B:
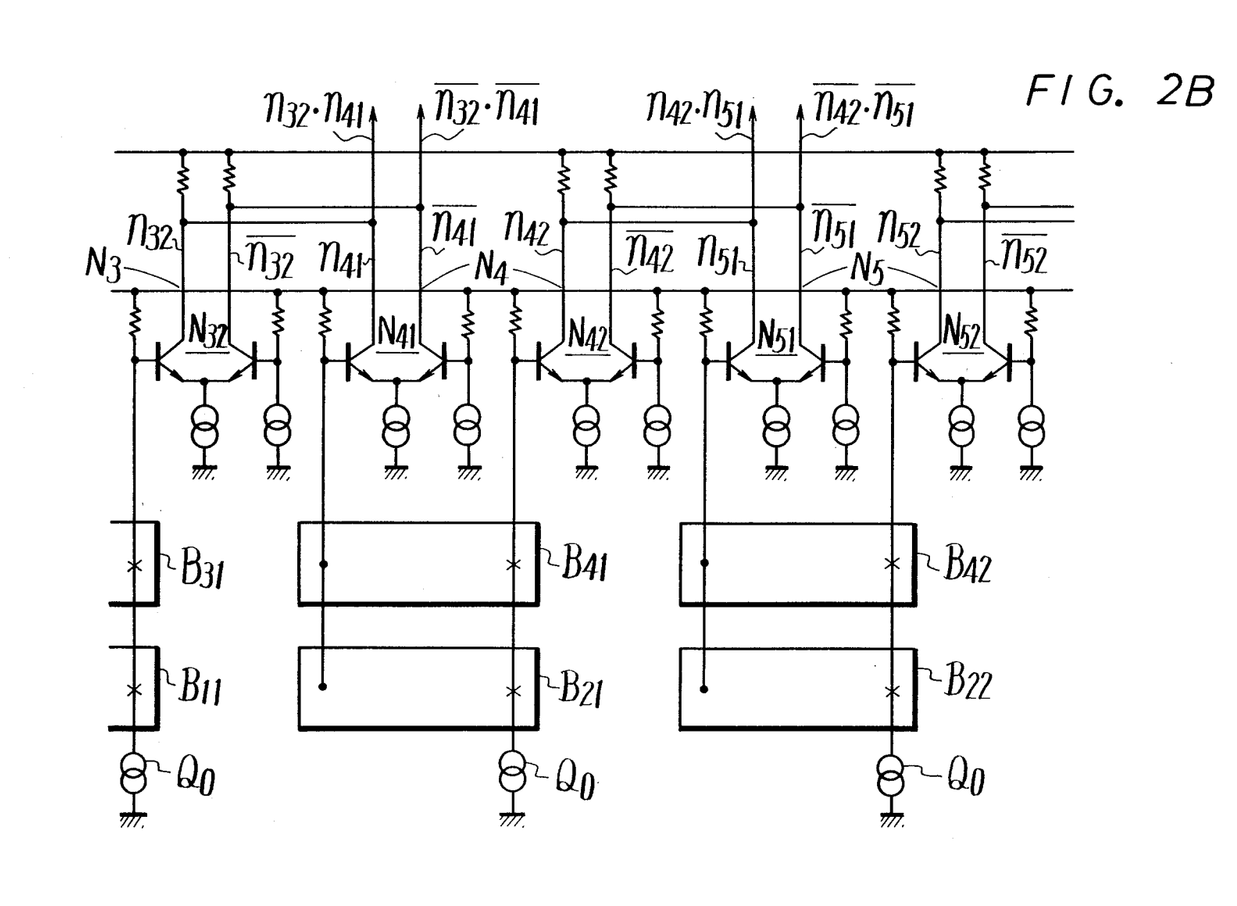
Figure 2C:
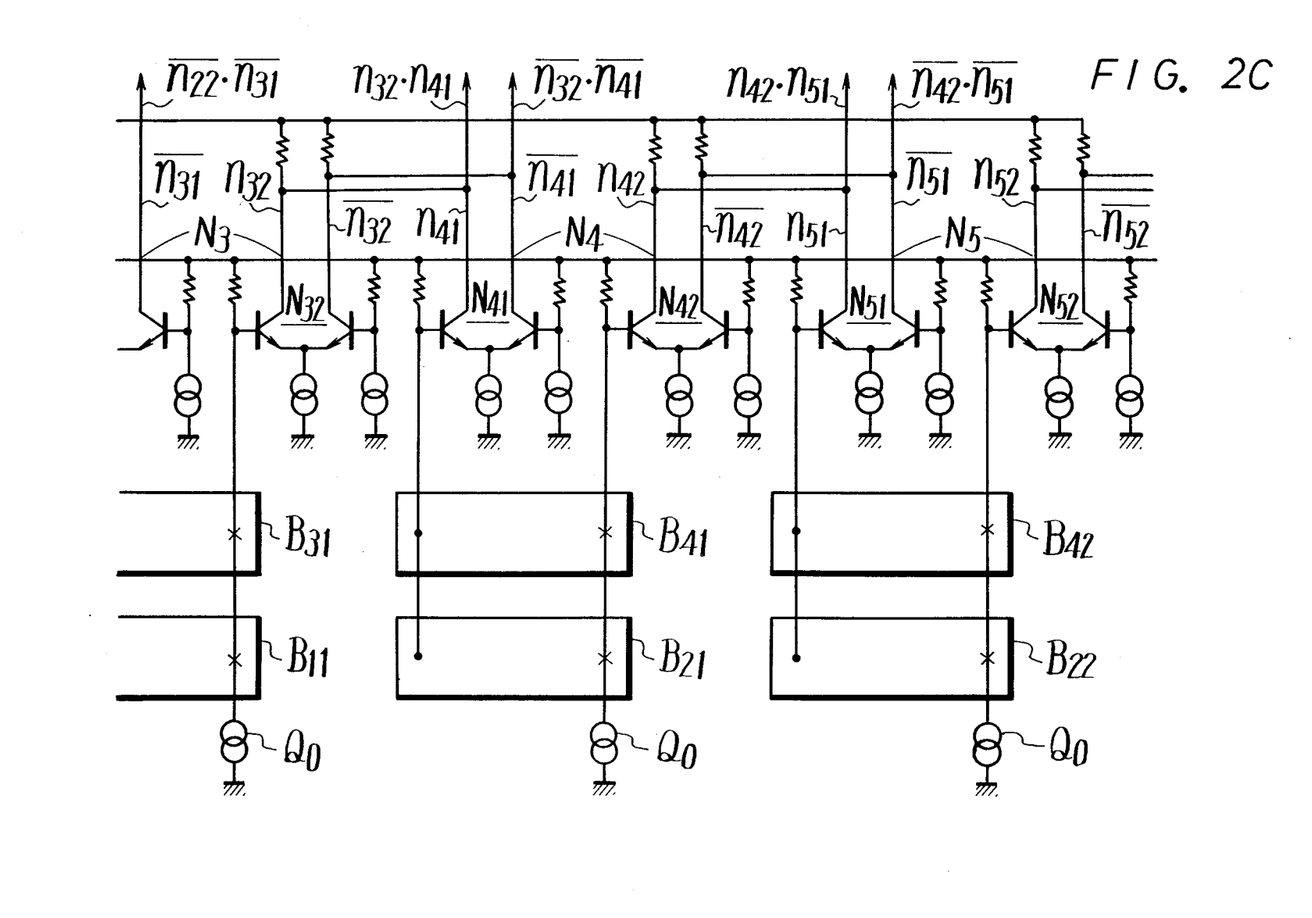
Figure 2D:
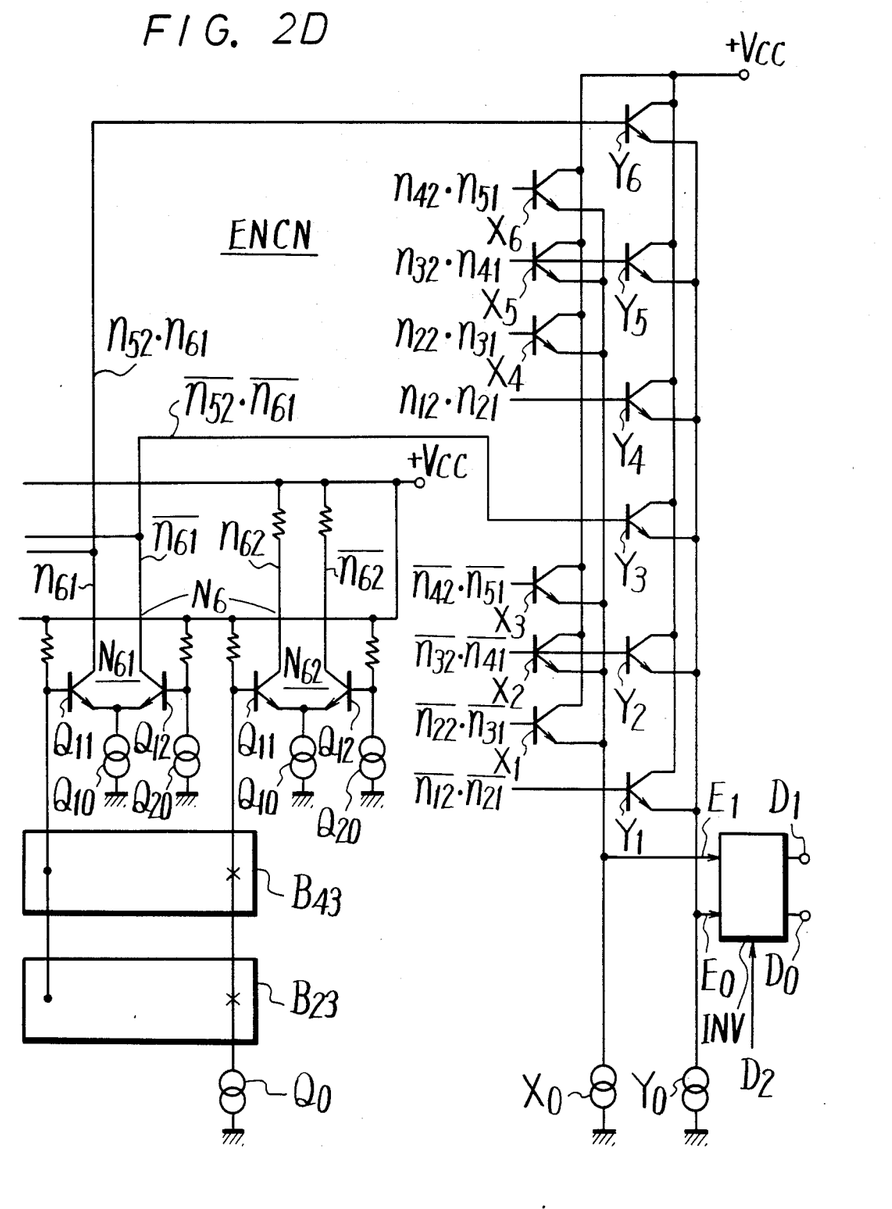

An embodiment of this invention will hereinafter be described with reference to FIGS. 1A-1D. In this embodiment, an analog input voltage Vin FIGS. 1B and 1D is converted to a digital output D3 to D0 (FIGS. 1A and 1B) of 4 bits. FIGS. 1A through 1D which together form one sheet of drawing (where the connected parts thereof are overlapped) may be thought of as forming a single FIG. 1.

In FIG. 1, for upper bits D3 and D2 of the digital output D3 to D0, there are provided three pairs of voltage comparators M3, M2, M1 and A3, A2, A1 respectively. In this case, each of the voltage comparators A3 to A1 comprises transistors Q1 and Q2 the emitters of which are connected together to a constant current source Q0 and the collectors of which are connected to inputs of the voltage comparators M3 to M1 respectively. The comparators A3 to A1 inherently function as the first stages of the comparators M3 to M1 respectively.

For lower bits D1 and D0 of the digital output D3 to D0, there are provided 6 voltage comparators N6 to N1, and voltage comparators Bij (i=4 to 1 and j=3 to 1) as a matrix therefor. Each of the voltage comparators Bij comprises transistors Q1 and Q2 the emitters of which are connected together to constant current sources Q0 together. The collectors of the transistors Q1 and Q2 in the comparators B3j and B1j are connected to the inputs of the comparators N1 to N3, respectively while the collectors of the transistors Q1 and Q2 in the comparators B4j and B2j are connected to the inputs of the comparators N6 to N4 respectively. Constant current sources Q0 are respectively connected to the collectors of the transistors Q2 in the comparators Bij. The comparators Bij inherently function as the first stages of the comparators N6 to N1.

16 resistors R all having the same resistance value are connected in series between a reference voltage source Vr and ground potential as a resistor string to generate reference voltages V15 to V0 of 16 steps. Within these reference voltages V15 to V0, the voltages V12, V8 and V4 of every four steps are respectively supplied to the bases of the transistors Q1 in the comparators A3 to A1. The voltages V15 to V13 and V11 to V9 are respectively supplied to the bases of the transistors Q1 of the comparators B43 to B41 and B31 to B33 and the remaining voltages V7 to V5 and V3 to V1 are respectively supplied to the bases of the transistors Q2 in the comparators B23 to B21 and B11 to B13. The analog input voltage Vin is respectively supplied to the bases of the transistors Q2 in the comparators A3 to A1 and the bases of the transistors within the transistors Q1 and Q2 in the comparators Bij to which up to that time, the voltages V15 to V1 were not yet supplied.

The magnitude of the constant current derived from each of the constant current sources Q0 for the comparators A3 to A1 and Bij is selected as I0.

Figure 3A:
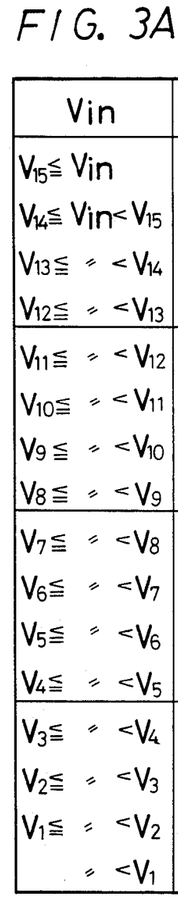
FIG. 3, FIGS. 4A and 4B are truth tables of encoders illustrated in FIGS. 1A, 1B, 1C, 1D and FIGS. 2A, 2B, 2C and 2D.
Figure 3B:
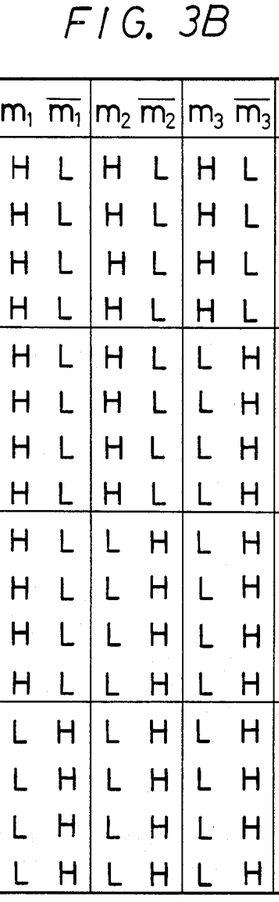
Figures 3C, 3D:
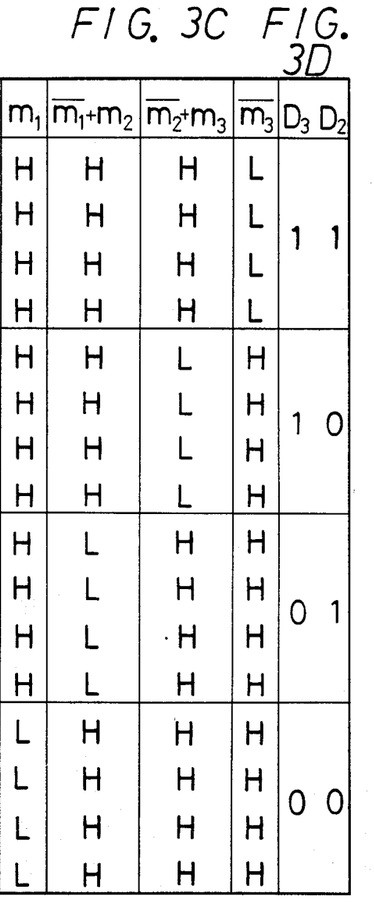

Output signals m1, $\overline{m1}$ to m3, $\overline{m3}$ from the comparators M1 to M3 respectively are supplied to an upper-bit encoder ENCM in which, as shown in FIG. 3C, the signals m1 to $\overline{m3}$ are calculated in the manner of OR-logic and the encoding shown in FIG. 3D is carried out in association with the above signals thereby yielding the upper bits D3 and D2.

The comparators N1 to N6 and a lower-bit encoder ENCN are arranged as, for example, shown in FIG. 2.

FIG. 2 is also formed of FIGS. 2A through 2D which together form one sheet of drawing. In FIG. 2, the comparators Bij are each shown in block in which marks . represent the collectors of the transistors Q1 and marks x represent the collectors of the transistors Q2, respectively.

Each of comparators Nk (k=1 to 6) is composed of two voltage comparators Nk1 and Nk2, and each of the comparators Nk1 and Nk2 comprises transistors Q11 and Q12 the emitters of which are connected together to a constant current source Q10. The transistors Q11 in the comparators Nk1 and Nk2 are connected at the bases thereof with the collectors of the transistors Q1 (marked by .) and the collectors of the transistors Q2 (marked by x) of the comparators B33, B13; B32, B12; B31, B11; B41, B21; B42, B22; and B43, B23, respectively. The transistors Q12 in the comparators Nk1 and Nk2 are connected at their bases with constant current sources Q20, respectively. Resistors r are connected between the bases of all the transistors Q11 and Q12 and voltage terminals, respectively. The magnitude of the constant current from the constant current source Q20 is selected as, for example, 1.5 I0.

The encoder ENCN comprises transistors X1 to X6 the emitters of which are connected together to a constant current source X0 and transistors Y1 to Y6 the emitters of which are connected to a constant current source Y0 together. If, now, the collector outputs from the transistors Q11 in the comparators Nk1 and Nk2 are taken as signals nk1 and nk2 and the collector outputs from the transistors Q12 therein are taken as signals $\overline{nk1}$ and $\overline{nk2}$, respectively, these signals are calculated in the manner of wired-AND logic to yield AND signals as:

| | |
|---|---|
| n12 · n21, | $\overline{n12} \cdot \overline{n21}$ |
| n22 · n31, | $\overline{n22} \cdot \overline{n31}$ |
| n32 · n41, | $\overline{n32} \cdot \overline{n41}$ |
| n42 · n51, | $\overline{n42} \cdot \overline{n51}$ |
| n52 · n61, | $\overline{n52} \cdot \overline{n61}$ |

These AND signals are supplied to the bases of the transistors X1 to X6 and Y1 to Y6 with the relation as shown in FIG. 2.

Emitter outputs E1 and E0 from the transistors X1 to X6 and Y1 to Y6 are supplied to a level control circuit INV which produces the lower bits D1 and D2 that can be represented as $\overline{E1}$ and $\overline{E0}$ when D2="1" and E1 and E0 when D2="0".

With the arrangement made so far, the upper bits D3 and D2 will be described first. The comparator A1, for example, is supplied with the voltage V4 as a reference voltage thereof so that when the analog input voltage Vin is smaller than the reference voltage V4 (Vin<V4), the transistor Q1 in the comparator A1 is made ON but the transistor Q2 therein is made OFF, thus achieving m1="L" and $\overline{m1}$="H" as viewing the 1st row to 4th row from the bottom in FIGS. 3A and 3B. When the reference voltage V4 is smaller than or equal to the analog voltage Vin (V4≦Vin), the transistor Q1 is made OFF but the transistor Q2 is made ON in the comparator A1 so that as shown in 2nd to 13th rows from the top in FIGS. 3A and 3B, m1="H" and $\overline{m1}$="L" are established. Then, the comparators A2 and A3 are respectively supplied with the reference voltages V8 and V12 so that the input voltage Vin and the signals m2 to $\overline{m3}$ are given as those shown in FIGS. 3A and 3B.

Accordingly, since the input voltage Vin and the logic and encoding of the encoder ENCM are given as those shown in FIGS. 3A and 3C, the upper bits D3 and D2 of the digital output are generated in association with the input voltage Vin as shown in FIG. 3D.

Next, the lower bits D1 and D0 will be described. If, now, the analog input voltage Vin is larger than or equal to the reference voltage V2 and smaller than the reference voltage V3 (V2≦Vin<V3), then, in the comparator B13;
  the transistor Q1: ON
  the transistor Q2: OFF
  and in the comparator B33;
  the transistor Q1: ON
  the transistor Q2: OFF
To these two transistors Q1 and Q1 flow the two collector currents I0 due to the two constant current sources Q0 which are connected to the emitters thereof so that a current 2I0 flows through to the respective resistor r which is connected to the base of the transistor Q11 in the comparator N11. Since the constant current from the constant current source Q20 is 1.5 I0, n11="H" and $\overline{n11}$="L" are established.

Although the two transistors Q2 in the comparators B13 and B33 are turned OFF, due to the constant current source Q0 the current I0 flows through the resistor r connected to the base of the transistor Q11 in the comparator N12 so that n12="L" and $\overline{n12}$="H" are established.

In the comparator B12;
the transistor Q1: ON
the transistor Q2: OFF
and in the comparator B32;
the transistor Q1: ON
the transistor Q2: OFF
thus, similarly, n21="H", $\overline{n21}$="L", n22="L" and $\overline{n22}$="H" are achieved, respectively.

In the comparator B11;
the transistor Q1: OFF
the transistor Q2: ON
and in the comparator B31;
the transistor Q1: ON
the transistor Q2: OFF
thus, due to the transistor Q1 in the comparator B31, the current I0 flows through the resistor r connected to the base of the transistor Q11 in the comparator N31 so that n31="L" and $\overline{n31}$="H" are established.

Due to the transistor Q2 in the comparator B11 and the constant current source Q0, the current 2I0 flows through the resistor r connected to the base of the transistor Q11 in the comparator N32 so that n32="H" and $\overline{n32}$="L" are established.

In the comparators B21 to B23;
the transistor Q1: OFF
the transistor Q2: ON
and in the comparators B41 to B43;
the transistor Q1: ON
the transistor Q2: OFF
Accordingly, due to the transistors Q1 in the comparators B41 to B43, the current I0 flows through the resistors r connected to the bases of the transistors Q11 in the comparators N41, N51 and N61, while due to the transistors Q2 in the comparators B21 to B23 and the constant current sources Q0 the current 2I0 flows through the resistors r connected to the bases of the transistors Q12 in the comparators N42, N52 and N62, thus giving rise to:

n41="L" and $\overline{n41}$="H"
n42="H" and $\overline{n42}$="L"
n51="L" and $\overline{n51}$="H"
n52="H" and $\overline{n52}$="L"
n61="L" and $\overline{n61}$ and "H"
n62="H" and $\overline{n62}$="L"

Figure 4A:
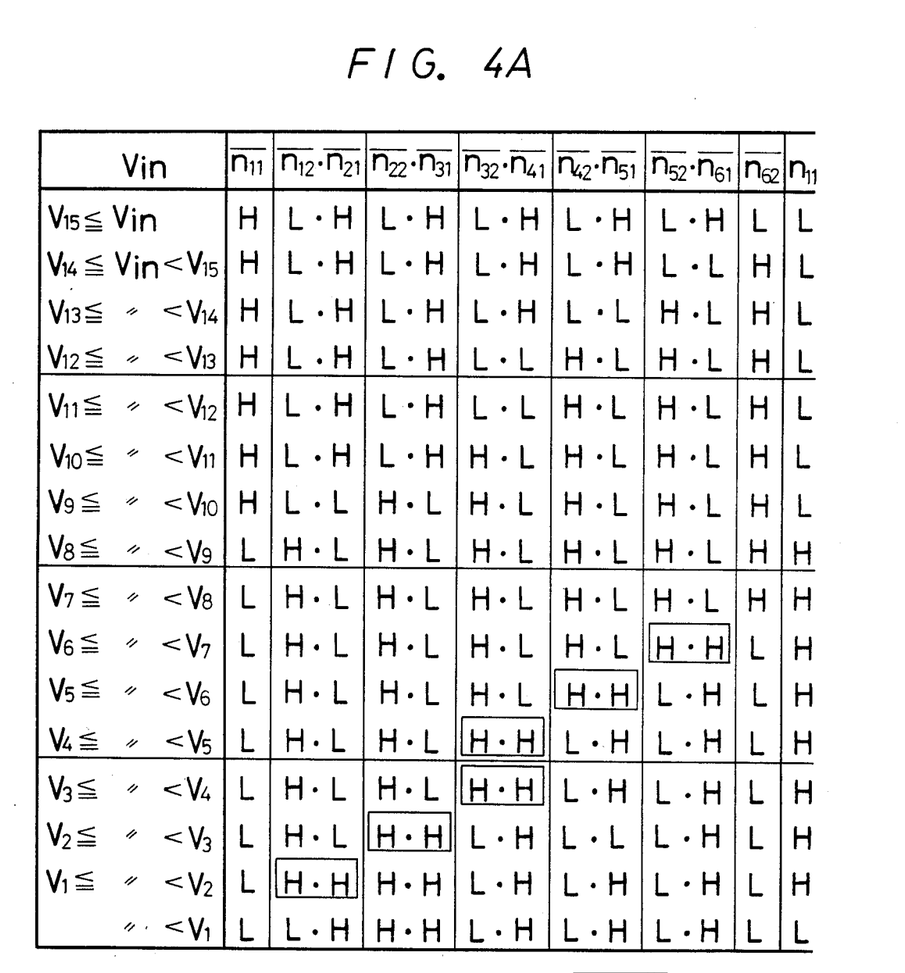
Figure 4B:
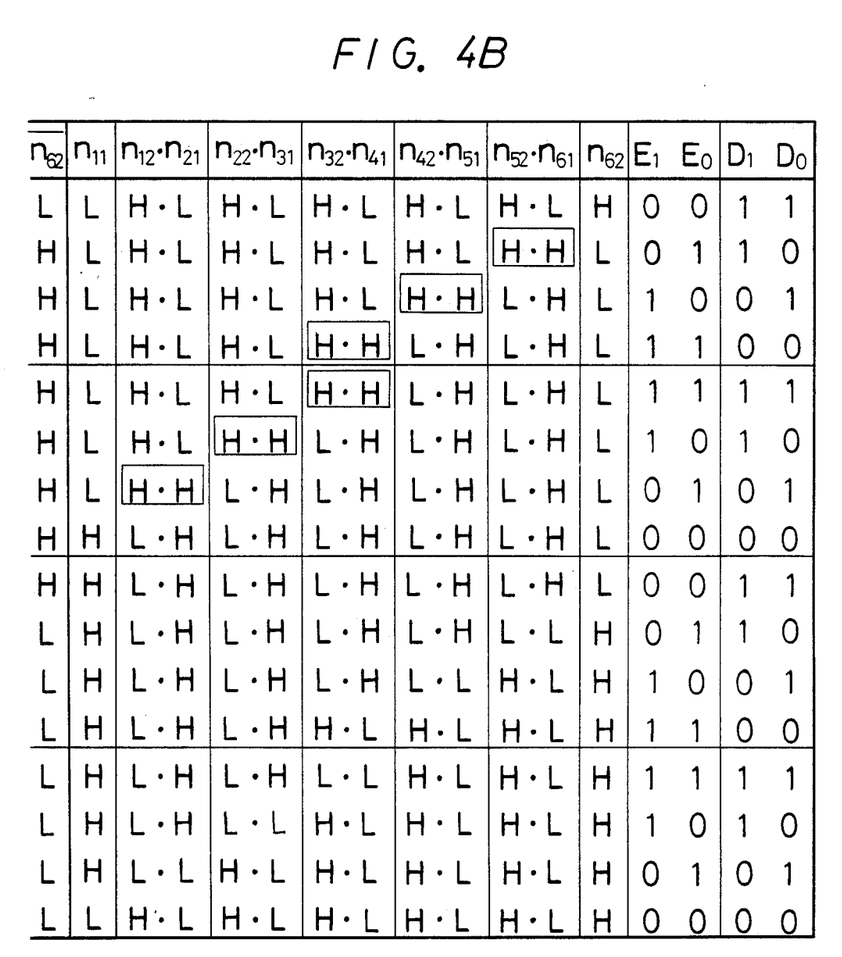

When these signals n11 to n62 are connected in the manner of wired-AND logic, as shown in 3rd row from the bottom of the table of FIG. 4 (FIGS. 4A and 4B are also combined to form one sheet of drawing), only an AND signal $\overline{n22}.n31$ becomes "H" and all other AND signals become "L"s.

Since the AND signal $\overline{n22}.n31$ that is represented by "H" is supplied to the transistor X1, E1="1" and E0="0" are established. Therefore, when the analog input voltage Vin is greater than or equal to V2 and smaller than V3 (V2≦Vin<V3), D2="0" is achieved as viewing the table of FIG. 3 so that D1=E1 and D0=E0 are satisfied in the control circuit INV. When the condition of V2≦Vin<V3 is satisfied, D3="0" is established as viewed from the table of FIG. 3.

Thus, the condition of V2≦Vin<V3 yields D3 to D0="0010". Since the analog input voltage Vin is at level corresponding to the second step counted from the ground side (ground potential is assumed to be at 0-th step level) and 2="0010" is achieved, the digital output D3 to D0="0010" is correct.

Similarly, the analog input voltage Vin, the signals n11 to $\overline{n62}$, the emitter outputs E0 and E1, and the lower bits D1 and D0 are given as those shown by the table of FIGS. 4A and 4B. Only the AND signals within the signals n11 to $\overline{n62}$ that correspond to the level of the input voltage Vin become at "H" and so the correct digital output D3 to D0 can be obtained.

As described above, according to the A/D converter of the invention, the reference voltages V15 to V0 are separated into four groups of voltages V15 to V12, V11 to V8, V7 to V4 and V3 to V0 and the voltages V12, V8, V4 (and V0) each of which represents the group thereof compared in voltage with the analog input voltage Vin thereby producing upper 2 bits D3 and D2 of the digital output D3 to D0. The reference voltages V15 to V0 which were utilized to generate the upper bits D3 and D2 are compared in voltage with the analog input voltage Vin to derive lower 2 bits D1 and D0 of the digital output D3 to D0. Therefore, upon A/D conversion, no error occurs in the connection portion between the upper bits D3 and D2 and the lower bits D1 and D0, thus resulting in A/D conversion with high precision.

Furthermore, the comparators A3 to A1 and Bij inherently function as the first stages of the comparators M3 to M1 and N6 to N1 respectively, and the encoders ENCN are of a simple arrangement. Accordingly, as is clear from FIGS. 1A to 1D and 2A to 2D, the number of circuit elements is reduced, and so this leads to improved economy of power consumption and smaller chip size for the IC.

Figure 5:
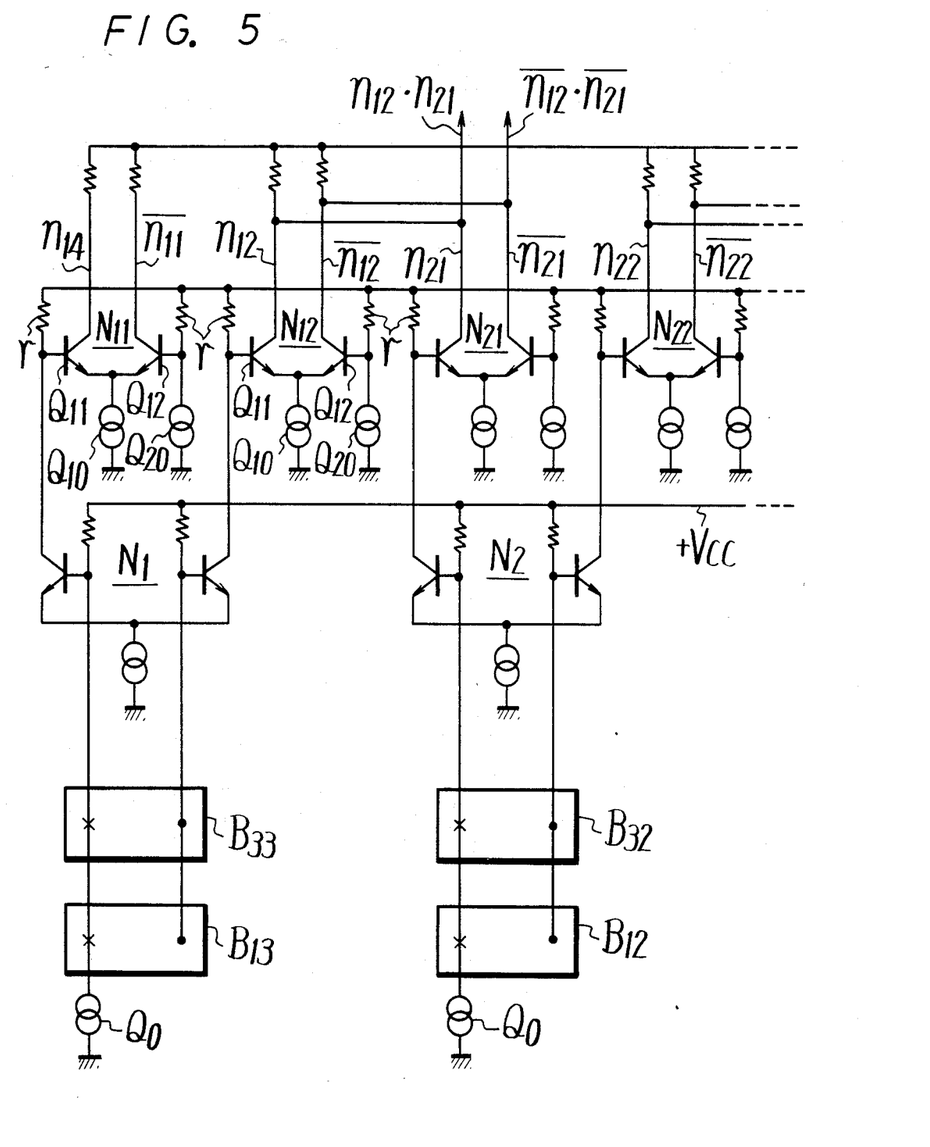
FIG. 5 illustrates another embodiment of the present invention.

While in the description as set forth above the outputs from the comparators Bij are directly supplied to the comparators N11 to N62, it is also possible that as shown in FIG. 5, the comparators N1 to N6 and N11 to N62 may be independently formed whereby the outputs from the comparators Bij may be defined as "H"s and "L"s in the comparators N1 to N6 and then conveyed to the comparators N11 to N62.

Although illustrative embodiments of the present invention have been described in detail above with reference to the accompanying drawings, it is to be understood that the invention is not limited to those precise embodiments, and that various changes and modification can be effected therein by one skilled in the art without departing from the spirit and scope of the invention, as defined by the appended claims.

What is claimed is:

1. An analog-to-digital converter for converting an analog input signal to a digital output signal with m upper bits and n lower bits having $(2^{m+n}-1)$ resistor means connected in a series circuit to a voltage source for establishing respective reference voltages, comprising:

$(2^m-1)$ upper-bit voltage comparator circuits having respective first input terminals receiving said analog input signal and respective second input terminals connected to said series circuit of resistor means at nodes thereof located at intervals of $2^n$ of said resistor means and defining $2^n$ groups of said resistor means therebetween for producing output signals representing respective voltage comparisons;

upper-bit encoder means receiving said output signals of said $(2^m-1)$ upper-bit voltage comparator circuits for generating therefrom said m upper bits;

a lower-bit matrix comparator circuit having $2^m(2^n-1)$ comparators arranged in pairs, the comparators of each pair having a first input terminal, a first output terminal connected to said first input terminal, a second input terminal and a second output terminal connected to said second input terminal, the first input terminal of each of said $2^m(2^n-1)$ comparators being connected to receive said analog input signal and the second input terminal of each of said $2^m(2^n-1)$ comparators being connected to respective remaining nodes of said series circuit of resistor means not connected to said second input terminals of said $(2^m-1)$ upper-bit voltage comparators for producing output signals representing respective voltage comparisons, the first output terminal of each of said comparators in each of said pairs being connected to the second output terminal of the other comparator in the same pair; and lower-bit encoder means connected to receive said output signals of said lower-bit matrix comparator circuit for generating therefrom said n lower bits.

2. An analog-to-digital converter of claim 1, in which said lower-bit encoder means comprises a wired logic circuit connected to receive said output signals from said lower-bit matrix comparator circuit and generating said n lower bits.

3. An analog-to-digital converter of claim 2, in which said wired logic circuits comprise logical AND gate circuits.

4. An analog-to-digital converter of claim 3, in which said logical AND gate circuits are constructed with respective pairs of comparators.

5. An analog-to-digital converter of claim 1, in which said upper-bit voltage comparator circuits comprise first-stage comparators and final-stage comparators, said first-stage comparators connected to said analog signal and said resistor means for producing outputs connected to said final-stage comparators.

6. An analog-to-digital converter of claim 1, in which said resistor means comprises a series string of equal value resistors.

7. An analog-to-digital converter of claim 1, in which said upper-bit encoder means and said lower-bit encoder means are constructed with bipolar transistors.

8. An analog-to-digital converter of claim 1, further comprising a plurality of current source means each having a current value of $I_o$ and being respectively connected to said lower-bit matrix comparator circuit.

9. An analog-to-digital converter for converting an analog input signal to a digital output signal with m upper bits and n lower bits having $(2^{m+n}-1)$ resistor means connected in a series circuit to a voltage source for establishing respective reference voltages, comprising:

$(2^m-1)$ upper-bit voltage comparator circuits having respective first input terminals receiving said analog input signal and respective second input terminals connected at $2^n$ nodes of said series circuit of resistor means and defining $2^n$ groups of said resistor means therebetween for producing output signals representing respective voltage comparisons;

upper-bit encoder means receiving said output signals of said $(2^m-1)$ upper-bit voltage comparator circuits for generating therefrom said m upper bits;

a lower-bit matrix comparator circuit having $2^m(2^n-1)$ comparators having respective first input terminals being connected to receive said analog input signal and respective second input terminals being connected to respective remaining nodes of said series circuit of resistor means not connected to said second input terminals of said $(2^m-1)$ upper bit voltage comparators for producing output signals representing respective voltage comparisons; and lower-bit encoder means connected to said output terminals of said lower-bit matrix comparator circuit for generating therefrom said n lower bits, said lower-bit encoder means comprising a wired logic circuit that comprises logical AND-gate circuits constructed with respective pairs of comparators and connected to receive said output signals from said lower-bit matrix comparator circuit and generating said n lower bits, one input of one of said pair of comparators forming said AND-gate circuits being respectively driven by a current source having a value of $1.5\ I_0$, where $I_0$ is the current value of a plurality of current source means connected to said lower-bit matrix comparator circuit.

10. An analog-to-digital converter for converting an analog signal to a digital signal having m upper bits and n lower bits, comprising:

voltage divider network means including $(2^{m+n}-1)$ resistors connected in series with a voltage source;

$(2^m-1)$ upper-bit voltage comparators having respective inputs receiving said analog signal and respective inputs connected to said voltage divider network means at $2^n$ intervals of said resistors and defining $2^n$ groups of said resistors for producing output signals representing respective voltage comparisons;

$2^m(2^n-1)$ lower-bit comparators arranged in pairs, the comparators of each pair having a first input terminal, a first output terminal connected to said first input terminal, a second input terminal and a second output terminal connected to said second input terminal, the first input terminal of each of said $2^m(2^n-1)$ comparators being connected to receive said analog signal and the second input terminal of each of said $2^m(2^n-1)$ comparators being connected to all remaining nodes of said voltage divider network to which said $(2^m-1)$ upper-bit comparators are not connected for producing output signals representing respective voltage comparisons, the first output terminal of each of said comparators in each of said pairs being connected to the second output terminal of the other comparator in the same pair;

encoder means connected to receive said output signals from said $(2^m-1)$ upper-bit comparators and said output signals from said $2^m(2^n-1)$ lower-bit comparators for generating therefrom said m upper bits and said n lower bits constituting said digital signal.

11. The analog-to-digital convertor of claim 10, in which each of said $(2^m-1)$ upper-bit voltage comparators comprise a two-stage comparator, the first stage of which being connected to said analog signal and to said voltage divider network and producing output signals therefrom fed to the second stage of said two-stage comparator.

12. An analog-to-digital convertor according to claim 10, further comprising logical AND gate circuits arranged between the outputs of said lower-bit comparator circuits and said encoder means for performing logical operations thereon.

13. An analog-to-digital convertor according to claim 12, in which said logical AND gates are formed of respective pairs of comparators.

14. An analog-to-digital convertor according to claim 10, in which said $2^m(2^n-1)$ lower-bit comparators are arranged as a matrix of comparators each connected to a respective current source having the current value of $I_o$.

15. An analog-to-digital converter for converting an analog signal to a digital signal having m upper bits and n lower bits, comprising:
- voltage divider network means including $(2^{m+n}-1)$ resistors connected in series with a voltage source;
- $(2^m-1)$ upper-bit voltage comparators having respective inputs receiving said analog signal and respective inputs connected to said voltage divider network means at $2^n$ intervals of said resistors and defining $2^n$ groups of said resistors for producing output signals representing respective voltage comparisons;
- $2^m(2^n-1)$ lower-bit comparators having respective inputs connected to receive said analog signal and respective inputs connected to all remaining nodes of said voltage divider network to which said $2^m-1$ upper bit comparators are not connected for producing output signals representing respective voltage comparisons;
- encoder means connected to receive said output signals from said $(2^m-1)$ upper bit comparators and said output signals from said $2^m(2^n-1)$ lower bit comparators for generating therefrom said m upper bits and said n lower bits comprising said digital signal;
- said $2^m(2^n-1)$ lower-bit comparators being arranged as a matrix of comparators each connected to a respective circuit source having the current value of $I_0$;
- further comprising logical AND gates connected between said outputs of said $2^m(2^n-1)$ lower-bit comparators and said encoder means for performing logical operations thereon, said AND gates being formed by respective pairs of comparators and said comparators being connected to a plurality of current source means each having the current value of 1.5 $I_0$.

* * * * *